US010103247B1

(12) United States Patent
Xie et al.

(10) Patent No.: US 10,103,247 B1
(45) Date of Patent: Oct. 16, 2018

(54) VERTICAL TRANSISTOR HAVING BURIED CONTACT, AND CONTACTS USING WORK FUNCTION METALS AND SILICIDES

(71) Applicant: GLOBALFOUNDRIES INC., Grand Cayman (KY)

(72) Inventors: Ruilong Xie, Schenectady, NY (US); Hui Zang, Guilderland, NY (US); Kangguo Cheng, Schenectady, NY (US); Tenko Yamashita, Schenectady, NY (US); Chun-chen Yeh, Danbury, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/785,631

(22) Filed: Oct. 17, 2017

(51) Int. Cl.
| | |
|---|---|
| *H01L 29/66* | (2006.01) |
| *H01L 29/78* | (2006.01) |
| *H01L 29/423* | (2006.01) |
| *H01L 27/088* | (2006.01) |
| *H01L 29/45* | (2006.01) |
| *H01L 21/8234* | (2006.01) |

(52) U.S. Cl.
CPC ........ *H01L 29/66666* (2013.01); *H01L 21/823418* (2013.01); *H01L 21/823437* (2013.01); *H01L 27/088* (2013.01); *H01L 29/4236* (2013.01); *H01L 29/42356* (2013.01); *H01L 29/42392* (2013.01); *H01L 29/45* (2013.01); *H01L 29/66787* (2013.01); *H01L 29/66795* (2013.01); *H01L 29/7827* (2013.01); *H01L 29/7851* (2013.01); *H01L 2029/7858* (2013.01)

(58) Field of Classification Search
CPC .......... H01L 29/4236; H01L 29/42392; H01L 29/66666; H01L 29/7827; H01L 27/0886; H01L 29/66787; H01L 29/66795; H01L 29/7851; H01L 29/785; H01L 29/7858
See application file for complete search history.

(56) References Cited

U.S. PATENT DOCUMENTS

| | | | | |
|---|---|---|---|---|
| 5,302,843 A | * | 4/1994 | Yamazaki | ............. H01L 27/088 257/296 |
| 6,492,212 B1 | | 12/2002 | Ieong et al. | |
| 6,642,575 B1 | * | 11/2003 | Ono | ................ H01L 21/823828 257/302 |
| 7,348,243 B2 | * | 3/2008 | Kim | .................... H01L 29/7827 438/268 |

(Continued)

*Primary Examiner* — Scott B Geyer
(74) *Attorney, Agent, or Firm* — Gibb & Riley, LLC; Yuanmin Cai

(57) ABSTRACT

Methods form a structure having a lower source/drain contacting a substrate at the bottom of a transistor. A semiconductor fin extends from the lower source/drain away from the bottom of the transistor. An upper source/drain contacts an opposite end of the fin at the top of the transistor. A gate conductor surrounds (but is electrically insulated from the fin) and includes a raised contact portion extending toward the top of the transistor. A buried contact is located at the bottom of the transistor, and is electrically connected to the first source/drain. A silicide and a conformal metal are between the buried contact and the first source/drain. The conformal metal is also between the gate conductor and the fin. A first contact extends to the buried contact, a second contact extends to the upper source/drain, and a third contact extends to the raised contact portion.

20 Claims, 11 Drawing Sheets

(56) References Cited

U.S. PATENT DOCUMENTS

| | | |
|---|---|---|
| 7,977,236 B2 | 7/2011 | Nejad et al. |
| 8,569,799 B2 | 10/2013 | Curatola et al. |
| 9,076,888 B2 | 7/2015 | Nejad et al. |
| 2009/0200604 A1* | 8/2009 | Chidambarrao .. H01L 29/66787 257/329 |
| 2013/0153989 A1* | 6/2013 | Masuoka .......... H01L 29/66666 257/329 |
| 2015/0041811 A1* | 2/2015 | Tegen ................. H01L 29/0696 257/51 |
| 2016/0336400 A1* | 11/2016 | Masuoka ........ H01L 21/823431 |
| 2016/0343854 A1* | 11/2016 | Masuoka ............ H01L 29/4238 |

* cited by examiner

VERTICAL TRANSISTOR HAVING BURIED CONTACT, AND CONTACTS USING WORK FUNCTION METALS AND SILICIDES

BACKGROUND

Field of the Invention

The present disclosure relates to vertical field effect transistors (VFETs), and more specifically, the VFETs that have a buried contact, and contacts that use work function metals and silicides.

Description of Related Art

Transistorized devices continue to enjoy size reductions because of technological advances. For example, gate all around (GAA) device structures are replacing fin-type field effect transistors (FINFET) in order to achieve continued scaling, which may otherwise be limited by poor electrostatics in FINFET devices. As a result, new constructs are being presented to allow continued scaling with GAA structures, such as vertical field effect transistors (VFET).

However, because VFETs are so small, it can be difficult to accurately align conductive contacts to the various components of VFETs. For example, VFETs include a lower source/drain, over which is formed a channel region and an upper source/drain, which makes is very difficult to form a contact to the lower source/drain, and to the gate that surrounds the channel region. Further, the various structures that form such buried contacts can reduce the "on" resistance (Ron), and such contacts can be adversely affected by thermal budgets used during manufacturing (which can affect threshold voltage (Vt) and contact resistance).

For example, VFETs can suffer from a high resistance bottom source/drain (S/D) contact because the contact to the bottom source/drain is typically placed at the edge of the VFET. Electrical current has to travel through the doped bottom source/drain, which typically has a much higher resistance than silicide and metal. Additionally, it is challenging to simultaneously form the gate and top source/drain contact trenches in the VFETs because of the contact depth difference between gate contact trench and top source/drain contact trench, where the gate contact trench is typically deeper than the top source/drain contact trench.

SUMMARY

Various structures herein include (among other components) a substrate located at the bottom of a transistor structure. In such structures, a lower conductive source/drain structure contacts the substrate, and a conductive buried contact is electrically connected to the lower conductive source/drain structure at the bottom of the transistor structure. The conductive buried contact is positioned the same distance from the substrate that the lower conductive source/drain structure is positioned from the substrate. Further, a silicide layer and a work function metal are between the conductive buried contact and the lower conductive source/drain structure.

Also, these structures include a semiconductor fin structure that contacts the lower conductive source/drain structure, and extends away from the bottom of the transistor structure toward the top of the transistor structure. A bottom spacer layer is on the lower conductive source/drain structure and abuts the semiconductor fin structure. The bottom spacer layer contacts the semiconductor fin structure and the lower conductive source/drain structure at a location where the semiconductor fin structure contacts the lower conductive source/drain structure.

A gate insulator layer (high-K insulator) contacts (and surrounds) the middle of the semiconductor fin structure, that is between the ends of the semiconductor fin structure. The gate insulator layer has a "L" shape when viewed in cross-section and, therefore, the gate insulator layer is positioned only along intersecting perpendicular planes formed by the semiconductor fin structure and the bottom spacer layer.

Further, a first conformal metal layer contacts the gate insulator layer, and a gate conductor surrounds the semiconductor fin structure and contacts the first conformal metal layer. Therefore, the gate insulator layer and the first conformal metal layer are between the semiconductor fin structure and the gate conductor. Also, the bottom spacer layer electrically separates the lower conductive source/drain structure from the gate conductor.

The first conformal metal layer surrounds three sides of the gate conductor in locations where the gate conductor is adjacent the semiconductor fin structure, and therefore, the first conformal metal layer has a "U" shape or "C" shape in cross-section (which is different from the "L" shape of the gate insulator in cross-section). Additionally, the gate conductor includes a raised contact portion extending from a location around the semiconductor fin structure toward the top of the transistor. The raised contact portion of the gate conductor extends toward the top of the transistor structure further from the substrate than the upper conductive source/drain structure is positioned from the substrate.

The first conformal metal layer is also separately located adjacent the conductive buried contact, and the first conformal metal layer contacts the silicide layer. More specifically, the first conformal metal layer is between the silicide layer and the conductive buried contact. Thus, the silicide layer and the first conformal metal layer physically and electrically connect the conductive buried contact to the lower conductive source/drain structure. The gate conductor and the conductive buried contact can be a different metal having a different work function (with a lower resistance) relative to the work function of the first conformal metal layer.

An upper conductive source/drain structure contacts the opposite end of the semiconductor fin structure from where the lower conductive source/drain structure contacts the semiconductor fin structure, at the top of the transistor structure. The upper conductive source/drain structure has a flared shape that is relatively smaller where the upper conductive source/drain structure contacts the semiconductor fin structure, and relatively larger where the upper conductive source/drain structure contacts the second conductive contact.

An insulator covers the transistor structure, and a first conductive contact extends through the insulator from the top of the transistor to the conductive buried contact. Further, a second conductive contact extends through the insulator from the top of the transistor to the upper conductive source/drain structure, and a third conductive contact extends through the insulator from the top of the transistor to the raised conductive contact portion of the gate conductor. The first contact is longer than the second contact, and the second contact is longer than the third contact.

The structures described herein can be formed using many methods. For example, these methods can form a lower conductive source/drain structure on a substrate located at the bottom of a transistor structure. These methods can also pattern a semiconductor fin structure to extend from the lower conductive source/drain structure away from the bottom of the transistor structure, and toward the top of the transistor structure. Methods herein then form a bottom spacer layer on the lower conductive source/drain structure to abut the semiconductor fin structure, form a gate insulator layer (high-K insulator) only along intersecting perpendicular planes formed by the semiconductor fin structure and the bottom spacer layer (to have an "L" shape in cross-section), and form a sacrificial gate layer around the semiconductor fin structure on the gate insulator layer. At this point (and before metals and silicides are formed) a high-temperature reliability anneal can be performed. By performing the reliability anneal at this point in the process, the later-formed metals and silicides are not subjected to the high temperatures of the reliability anneal, which prevents the metals and silicides from suffering high-temperature damage.

Such methods form spacers on the sacrificial gate layer that contact the semiconductor fin structure. Such spacers are formed to have an upper conductive source/drain opening exposing the semiconductor fin structure. These methods then form an upper conductive source/drain structure in the upper conductive source/drain opening, and on an opposite end of the semiconductor fin structure from where the lower conductive source/drain structure contacts the semiconductor fin structure (at the top of the transistor structure). The upper conductive source/drain opening includes a flared opening that is relatively smaller where the upper conductive source/drain structure contacts the semiconductor fin structure, and relatively larger at a location toward the top of the transistor structure from the semiconductor fin structure. This forms the upper conductive source/drain structure to have a flared shape that is relatively smaller where the upper conductive source/drain structure contacts the semiconductor fin structure, and relatively larger where the upper conductive source/drain structure contacts the second conductive contact. At this point (and before metals and silicides are formed) a high-temperature dopant activation thermal anneal can be performed. By performing the dopant activation thermal anneal at this point in the process, the later-formed metals and silicides are not subjected to the high temperatures of the dopant activation thermal anneal, which prevents the metals and silicides from suffering high-temperature damage.

A first protective layer is formed on the upper conductive source/drain structure by such methods to be larger than dimensions of the upper conductive source/drain structure when viewed from the top of the transistor structure. These methods remove a portion of the lower conductive source/drain structure that is not protected by the first protective layer to leave sidewalls of the lower conductive source/drain structure exposed, which forms a buried contact area in the lower conductive source/drain structure on a first side of the semiconductor fin structure. The buried contact area is formed to be positioned the same distance from the substrate that the lower conductive source/drain structure is positioned from the substrate.

This allows the methods herein to form a silicide layer on the sidewalls of the lower conductive source/drain structure in the buried contact area. Such methods also remove the sacrificial gate layer to leave the gate insulator layer exposed. Also, such methods deposit a first conformal metal layer on the silicide layer in the buried contact area, and around the semiconductor fin structure on the gate insulator layer. Then, these methods deposit a second conductor on the first conformal metal layer, to fill all empty areas from the bottom of the transistor structure to the top of the transistor structure with the second conductor. The gate conductor and the conductive buried contact can be a different metal having a different work function (with a lower resistance) relative to the work function of the first conformal metal layer.

These methods further pattern a second protective layer on the second conductor, on a second side of the semiconductor fin structure that is opposite the first side of the semiconductor fin structure. This allows such methods to remove portions of the first conformal metal layer and the second conductor not protected by the second protective layer to leave the first conformal metal layer and the second conductor in the buried contact area and around the semiconductor fin structure on the gate insulator layer.

Additionally, the portion of the first conformal metal layer and the second conductor protected by the second protective layer forms a raised contact portion extending from a location around the semiconductor fin structure toward the top of the transistor. The raised contact portion of the gate conductor is formed to extend toward the top of the transistor structure further from the substrate than the upper conductive source/drain structure is positioned from the substrate.

Methods herein cover the transistor structure with a second insulator layer from the bottom of the transistor structure to the top of the transistor structure, and pattern the second insulator layer to form contact openings in the second insulator layer to the buried contact, to the upper conductive source/drain structure, and to the raised contact portion of the gate conductor. This allows such methods to form conductive contacts in the contact openings, including: a first contact extending through the second insulator layer to the buried contact; a second contact extending through the second insulator layer to the upper conductive source/drain structure; and a third contact extending through the second insulator layer to the raised contact portion of the gate conductor. The first contact is formed longer than the second contact, and the second contact is formed longer than the third contact.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, the various structures that form buried contacts in VFETs can reduce the "on" resistance (Ron) of the transistor. Further, such contacts can be adversely affected by thermal budgets, which anneal the high-k gate dielectric to meet the reliability requirement or anneal the top S/D to activate the dopant. The methods herein address these issues by providing a silicided buried bottom source/drain contact formed together with raised gate conductor contact (PB) in a self-aligned high-K first replacement gate flow. Thus, this disclosure presents methods to fabricate a raised gate conductor portion with a buried bottom metal contact, which is are self-aligned to a high-K first replacement gate. This produces a structure claim having a raised gate conductor portion, with no high-K material at the top region, a buried contact, with a work function metal (WFM) on top of a silicide.

More specifically, as shown below, the methods herein form a structure having a lower source/drain contacting a substrate at the bottom of a transistor. A semiconductor fin extends from the lower source/drain away from the bottom. An upper source/drain contacts an opposite end of the fin at the top of the transistor. A gate conductor surrounds (but is electrically insulated from the fin) and includes a raised contact portion extending toward the top of the transistor. A buried contact is located at the bottom of the transistor, and is electrically connected to the first source/drain. A silicide and a conformal metal are between the buried contact and the first source/drain. The conformal metal is also between the gate conductor and the fin. A first contact extends to the buried contact, a second contact extends to the upper source/drain, and a third contact extends to the raised contact portion.

With such structures, the source/drain dopant activation thermal anneal and the reliability anneal of the high-K gate insulator are preformed before the silicide, work function metal, and gate conductor are formed; and, therefore such heating processes will not adversely affect the metal gate or silicide. Further, the taller gate conductor raised contact portion makes it easier to form an external contact, and the buried bottom contact lowers "on" resistance.

Figure 7A:
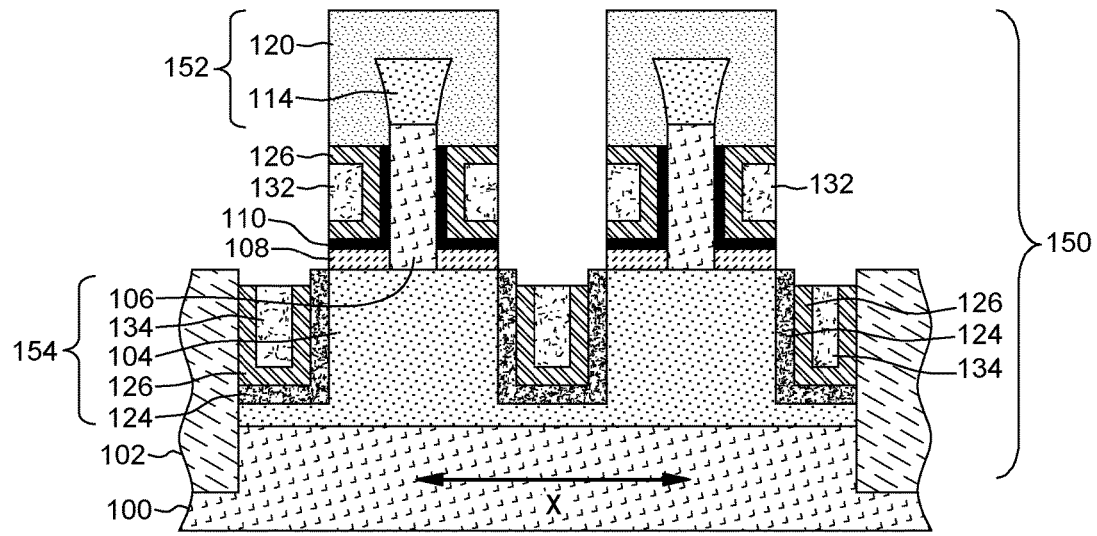
Figure 7B:
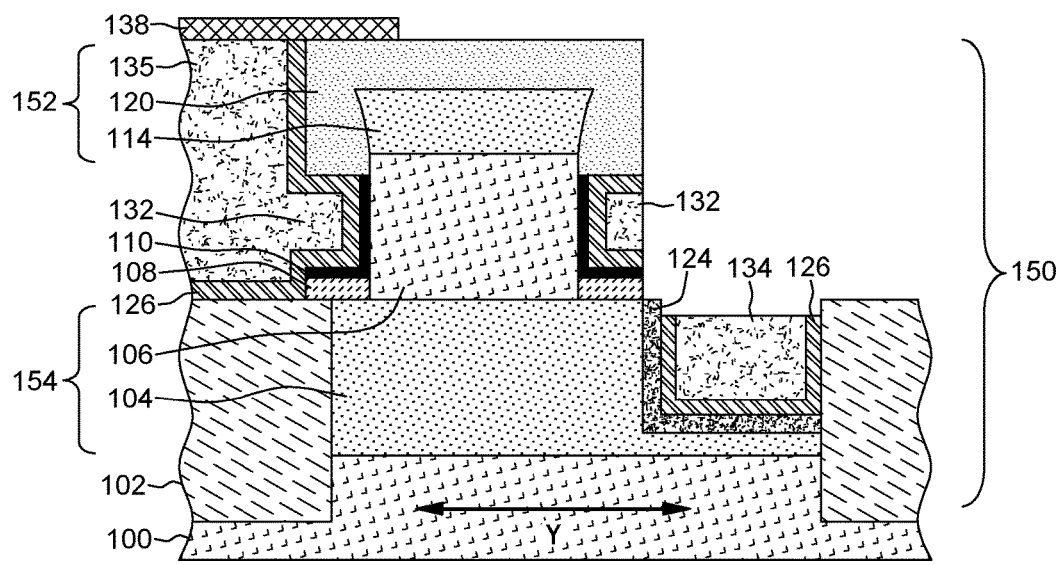
Figure 8A:
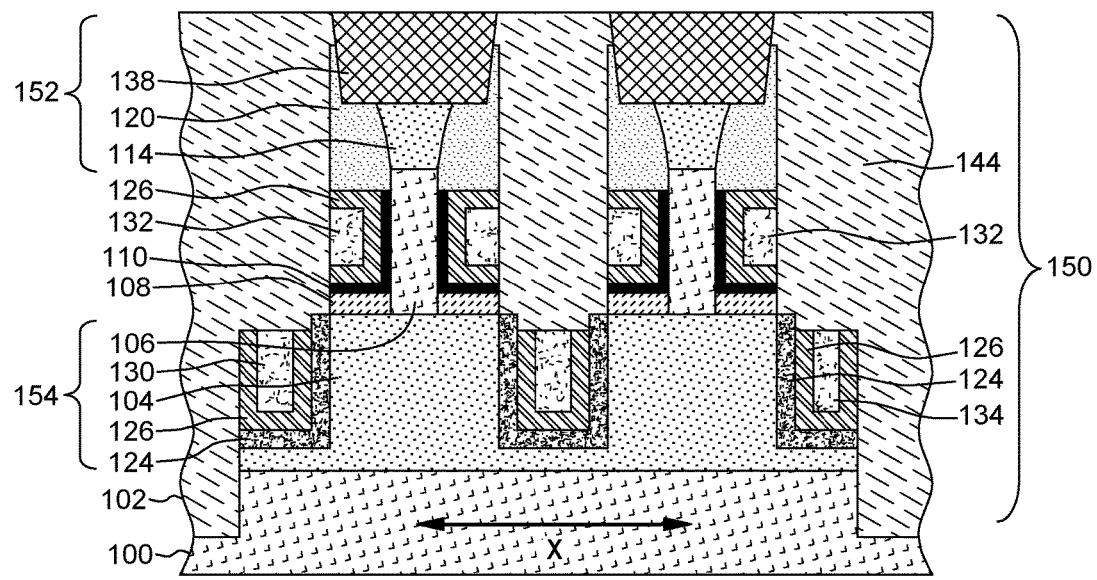
Figure 8B:
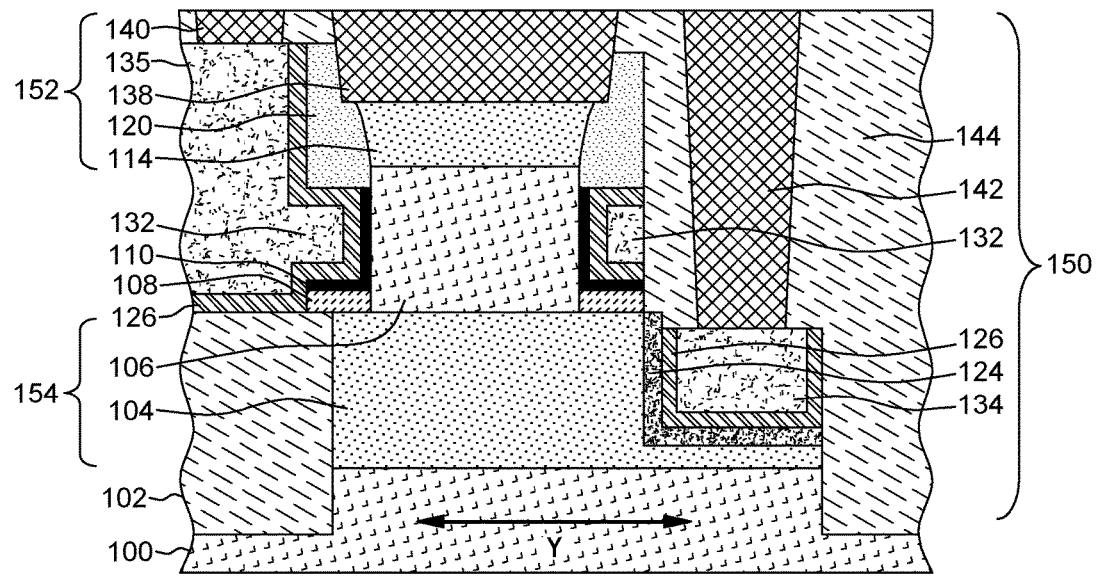
Figure 9:
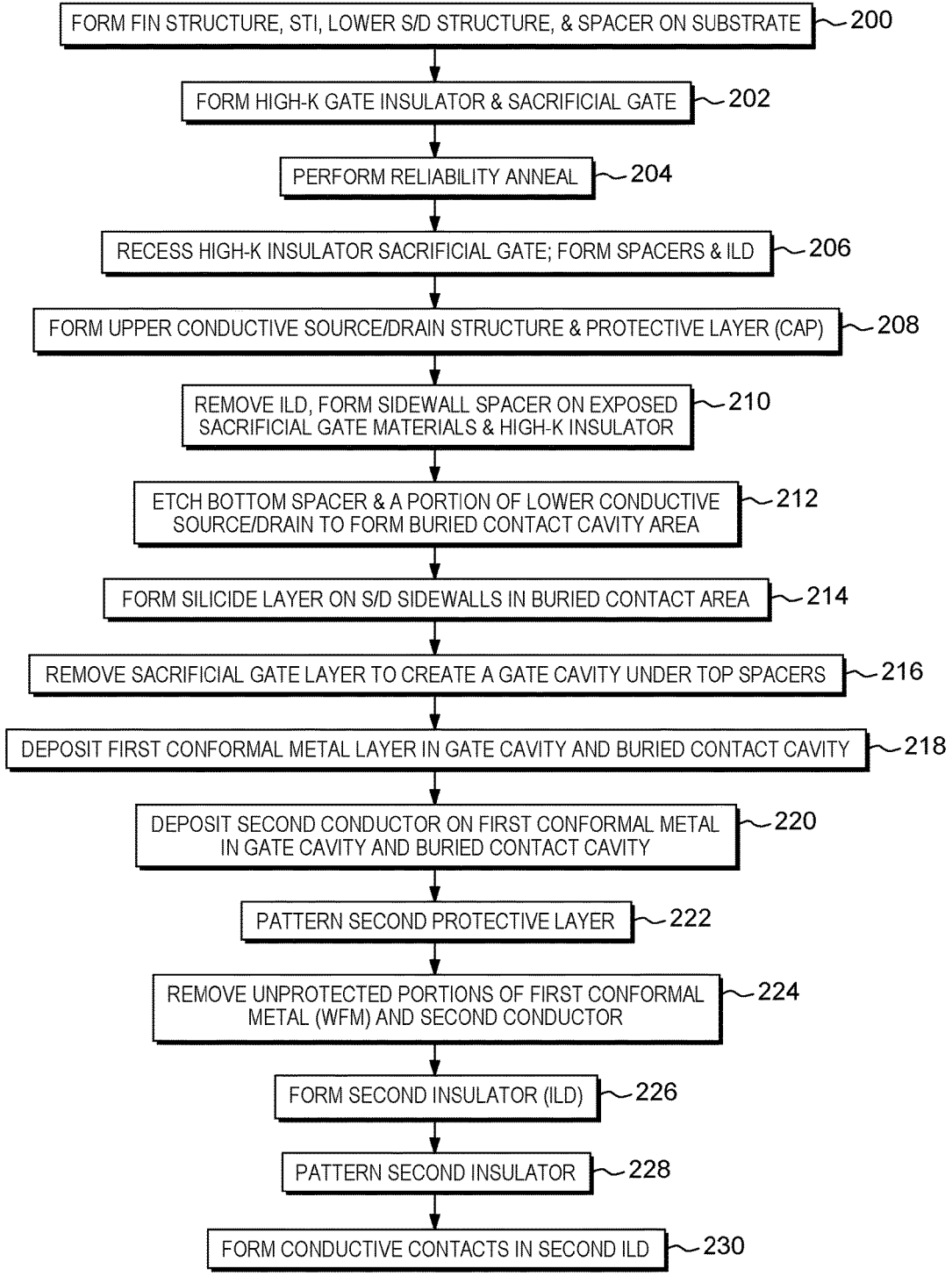
FIG. 9 is a flow diagram illustrating embodiments herein.

Referring now to the drawings, FIGS. 1A-8B show various stages of manufacture of two adjacent VFET structures (with FIGS. 8A-8B showing the final structure) and FIG. 9 is a flowchart illustrating such processing in flow form. In the following discussion the flowchart in FIG. 9 is used to explain the processes performed in FIGS. 1A-8B. FIG. 1C illustrates a top view of transistors herein, and the "A" Figures (e.g., FIG. 1A, 2A, . . . 8A) illustrate a cross-sectional view along line X in FIG. 1C, which corresponds to the cut across the VFET FINs; while the "B" Figures (e.g., FIG. 1B, 2B, . . . 8B) illustrate a cross-sectional view along line Y in FIG. 1C, which corresponds to cut along the VFET FIN.

Note that within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor. Further, transistor structures are formed by depositing or implanting impurities (or by forming doped materials using deposition or epitaxial growth processes) to form at least one semiconductor channel region. As used herein, "implantation processes" can take any appropriate form (whether now known or developed in the future) and can be, for example, ion implantation, etc.

Figure 1A:
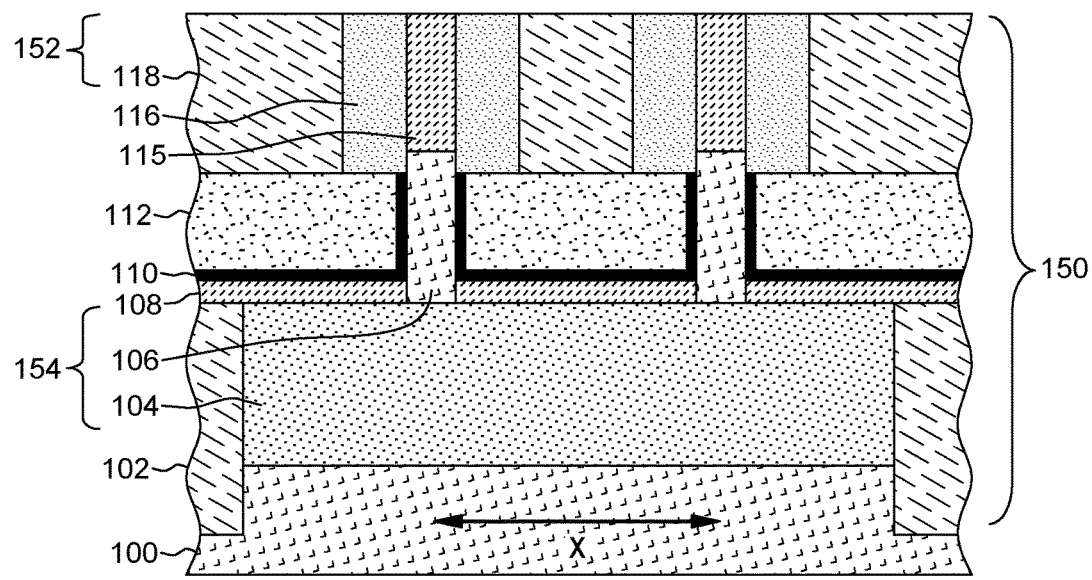
FIGS. 1A-1B are different cross-sectional diagrams of transistor structures according to embodiments herein.
Figure 1B:
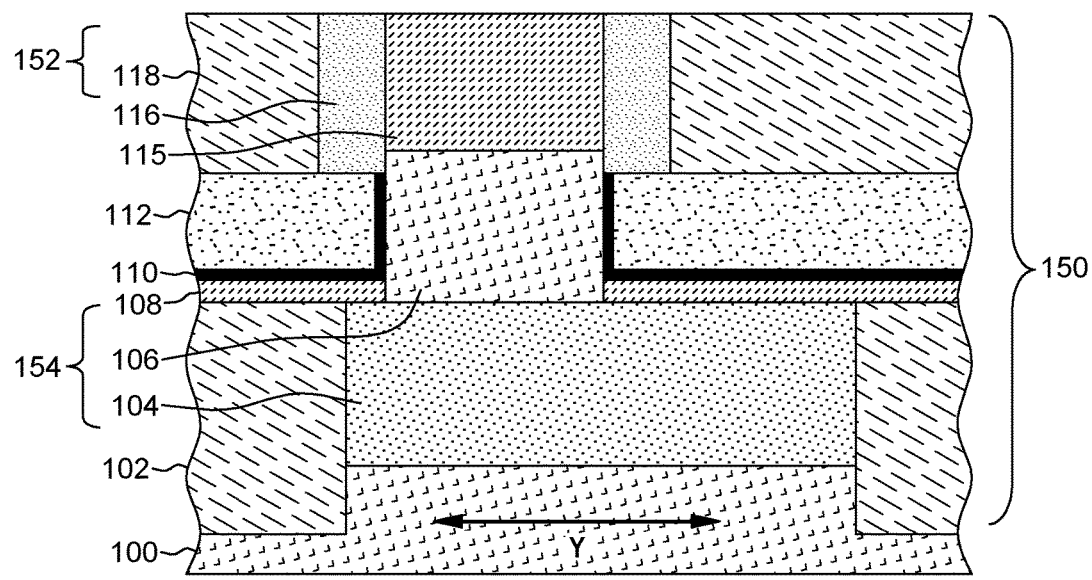
Figure 1C:
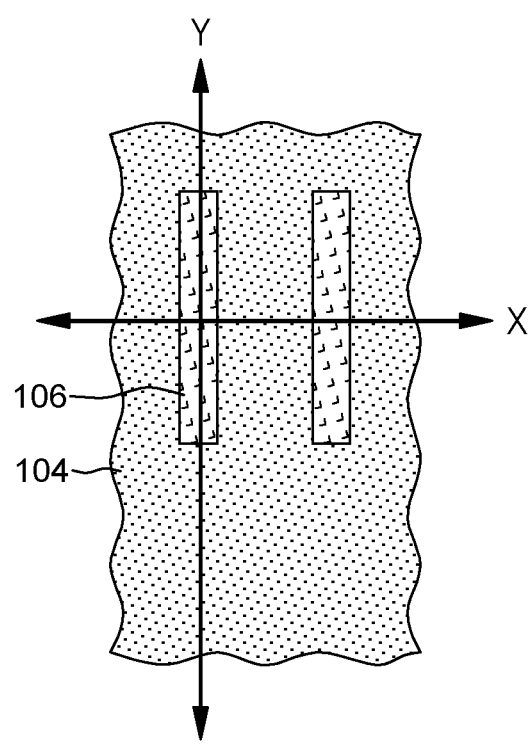
FIG. 1C is a top-view diagram of transistor structures according to embodiments herein.

As shown in item 200 in FIG. 9, and in FIGS. 1A-1C, methods herein form "shallow trench isolation" (STI) structures 102, a lower conductive source/drain structure 104 (e.g., by implanting impurities into a substrate 100 located at the bottom 154 of a transistor structure 150) and pattern a semiconductor fin structure 106. A "substrate" herein can be any material appropriate for the given purpose (whether now known or developed in the future) and can be, for example, Si, SiC, SiGe, SiGeC, other III-V or II-VI compounds, or organic structures, etc., such as bulk silicon wafers, silicon on insulator (SOI) structures, etc.

FIGS. 1A-1B also illustrate STI structures 102 that are generally formed by patterning openings/trenches within the substrate and growing or filling the openings with a dielectric material (this allows different active areas of the substrate to be electrically isolated from one another). The dielectrics herein may be formed by CVD deposition, followed by CMP and recess, and can be SiO2, or SiN, or a combination of thin SiN liner followed by SiO2.

As noted above, these methods also pattern a semiconductor fin structure 106, in item 200 in FIG. 9, to extend from the lower conductive source/drain structure 104 away from the bottom 154 of the transistor structure 150, and toward the top 152 of the transistor structure 150. Note that "bottom" and "top" are arbitrary terms used to define the locations of the transistor 150 that are close to the substrate 100 (the bottom 154) and distal to, or further away from, the substrate 100 (the top 152). In one example, the fins can be formed using a patterned hardmask 115, such as a SiCO hardmask. A hardmask can be formed of any suitable material, whether now known or developed in the future, such as a metal or organic hardmask, that has a hardness greater than the substrate and insulator materials used in the remainder of the structure. Also, for purposes herein, a "semiconductor" is a material or structure that may include an impurity that allows the material to sometimes be a conductor and sometimes be an insulator, based on electron and hole carrier concentration. A fin is a 6-sided rectangular structure with four sides and two ends (with possibly rounded corners), where the sides all have the same length and two of the sides have the same width as the ends, and the other two sides are much wider (e.g., 2×, 4×, 10×, 20×, etc.) than the ends, and this forms a narrow, tall structure that extends from a connected layer (such as a substrate).

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Also, in item 200 in FIG. 9, a bottom spacer layer 108 is formed on the lower conductive source/drain structure 104 (and to abut the semiconductor fin structure 106) by depositing or growing any appropriate insulator (as shown in FIGS. 1A-1B).

Methods herein form a gate insulator layer 110 (high-K insulator) to contact and surround the middle of the semiconductor fin structure 106, in item 202. These methods further form of a sacrificial gate layer 112 around the semiconductor fin structure 106 on the gate insulator layer 110 in item 202. This can be followed by a high temperature (e.g., >1000 C) reliability anneal process, as shown in item 204. Performing the high-temperature anneal at this point in processing (and before silicides and metals are formed) prevents such later-formed silicides and metals from being affected by such high-temperature processing.

Note that a thin nitride (e.g., TiN, etc.) can be formed on the gate insulator 110 (between the gate insulator 110 and the sacrificial gate layer 112) in some structures and, therefore, element 112 is intended to illustrate a sacrificial a-Si gate with a very thin TiN layer over the high-k layer 110, in some embodiments. The gate insulator layer 110 has a "L" shape when viewed in cross-section and, therefore, the gate insulator layer 110 is positioned only along intersecting perpendicular planes formed by the semiconductor fin structure 106 and the bottom spacer layer 108. More specifically, the gate insulator layer 110 is first adjacent (and parallel to) the bottom spacer 108, and secondly adjacent (and parallel to) the fin 106 sidewall; thereby, being adjacent to two sides of the gate conductor 132 (and this allows the first conformal metal layer 126 to have an "L" shape in cross-section).

Figure 2A:
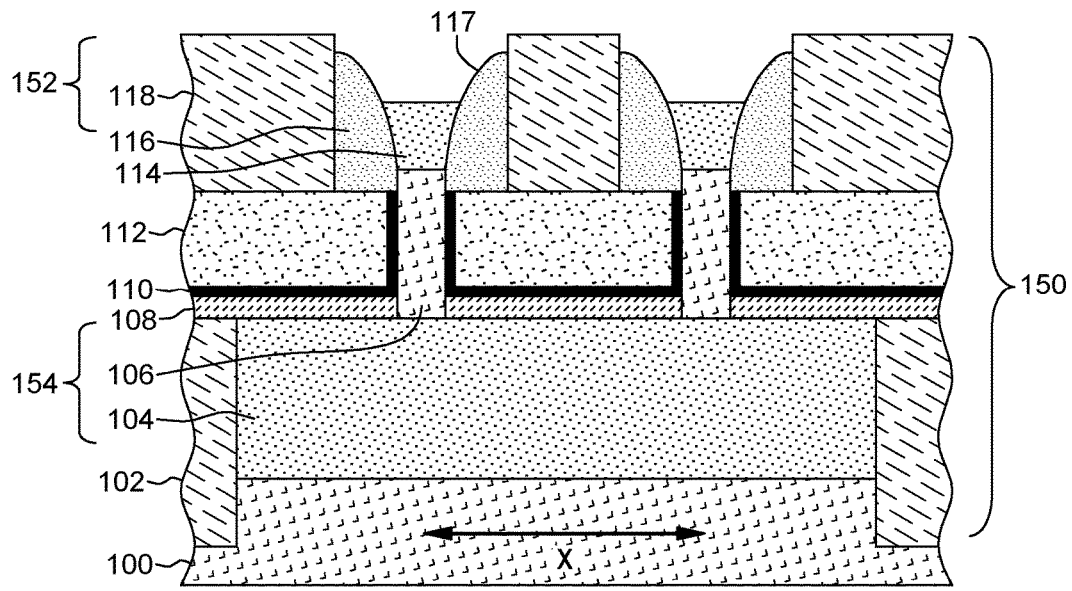
FIGS. 2A-8B are different cross-sectional diagrams of transistor structures according to embodiments herein.
Figure 2B:
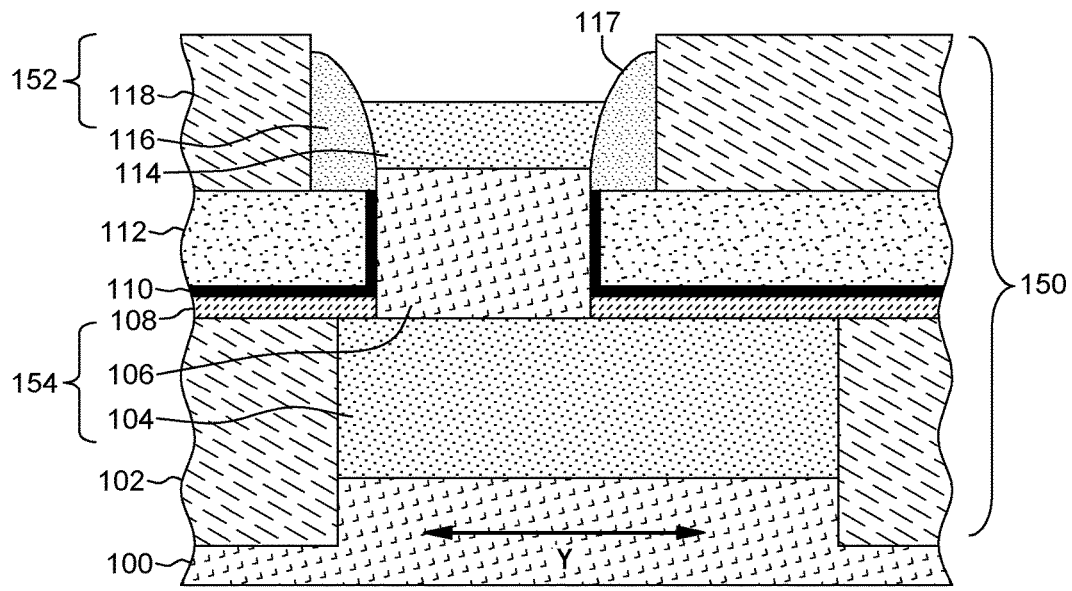

As shown in item 206 in FIG. 9, such methods recess the sacrificial materials 112 and the high-k gate insulator 110, and form top spacers 116 over the recessed sacrificial gate materials 112 and high-k gate insulator 110, and form a first ILD dielectric 118 Such spacers 116 contact the semiconductor fin structure 106, and have an upper conductive source/drain opening 117 exposing the semiconductor fin structure 106. As shown in FIGS. 2A-2B, these methods pattern the upper conductive source/drain opening 117 in item 206 to be flared (e.g., in a selective SiCO etch back process, or similar). In other words, the flared upper conductive source/drain opening 117 is relatively smaller where the upper conductive source/drain structure 114 contacts the semiconductor fin structure 106, and relatively larger at a location toward the top 152 of the transistor structure 150 (e.g., distal to the semiconductor fin structure 106).

In item 208 in FIG. 9, and again as shown in FIGS. 2A-2B, such methods then form (e.g., epitaxially grow, deposit, etc.) an upper conductive source/drain structure 114 in the upper conductive source/drain opening 117. This forms the upper conductive source/drain structure 114 on an opposite end of the semiconductor fin structure 106 from where the lower conductive source/drain structure 104 contacts the semiconductor fin structure 106, at the top 152 of the transistor structure 150. The upper conductive source/drain structure 114 can be formed of a similar material to that of the lower conductive source/drain structure 104 (or possibly a different conductive material). Also, the flared upper conductive source/drain opening 117 forms the upper conductive source/drain structure 114 in item 208 to have a flared shape that is relatively smaller where the upper conductive source/drain structure 114 contacts the semiconductor fin structure 106, and relatively larger where the upper conductive source/drain structure 114 contacts the second conductive contact.

A dopant activation thermal anneal can be performed as part of 208 to properly form the upper conductive source/drain structure 114 (and potentially the lower conductive source/drain structure 104) as final conductors. Again, performing such an anneal process at this point in processing (and before silicides and metals are formed) prevents such later-formed silicides and metals from being affected by such high-temperature processing.

Figure 3A:
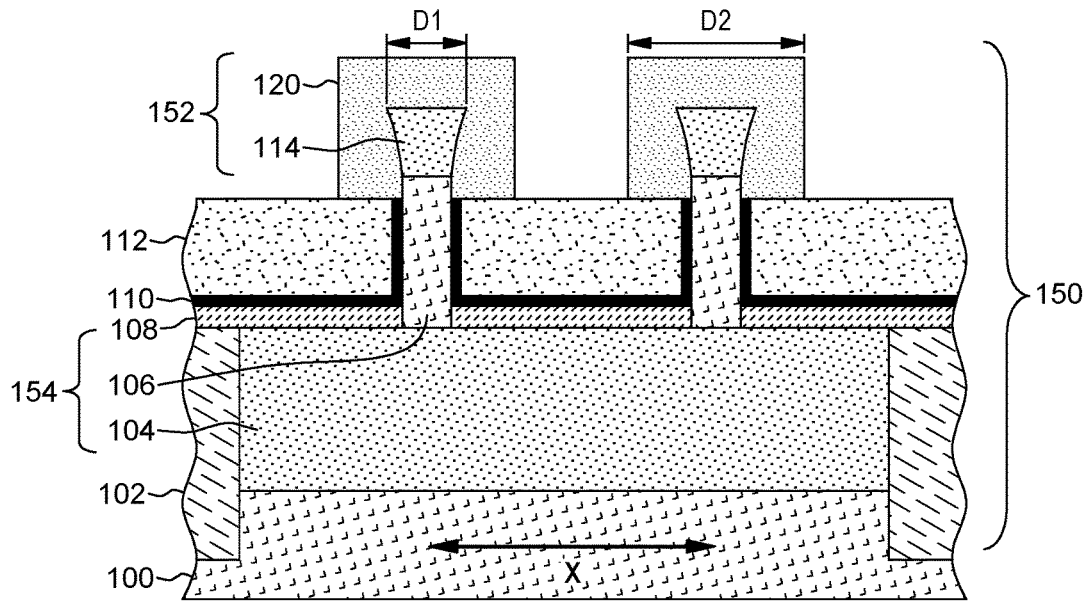
Figure 3B:
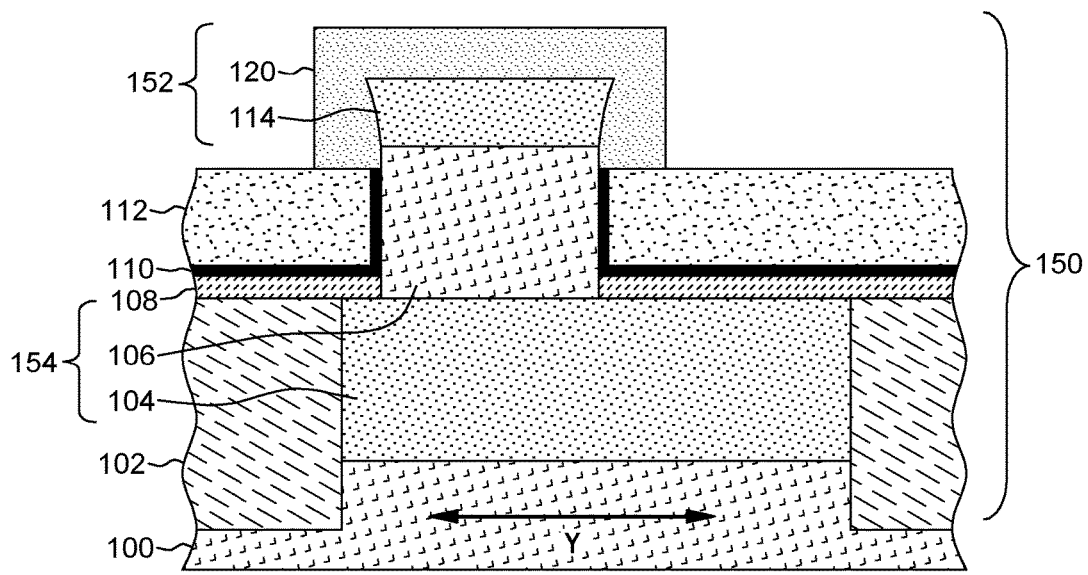

In item 208 in FIG. 9, and as shown in FIGS. 3A-3B, a first protective layer 120 (e.g., such as SiN, etc.) is formed on the upper conductive source/drain structure 114. With such methods, the first protective layer 120 is formed to be larger than dimensions of the upper conductive source/drain structure 114 (for example, when viewed from the top 152 of the transistor structure 150) where dimension D2 of the first protective layer 120 is greater than dimension D1 of the upper conductive source/drain structure 114, as shown in FIG. 3A.

Figure 4A:
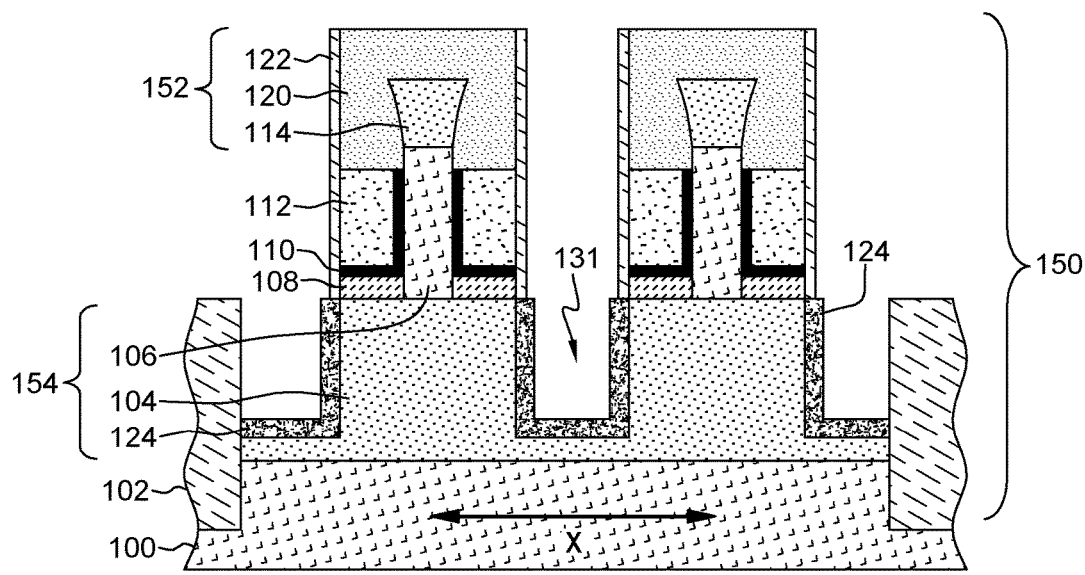
Figure 4B:
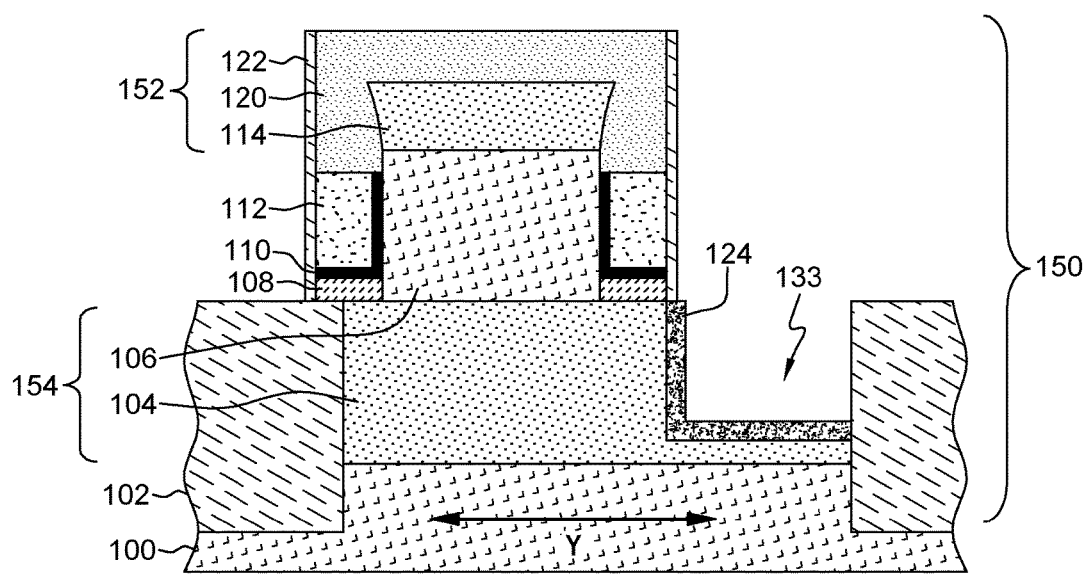

Further, as shown in item 210 in FIG. 9, such processing etches the upper insulator layer 118 (first ILD) and this exposes the sacrificial gate materials 112 that are not protected by the first protective layer 120 (cap), as shown in FIGS. 3A-3B. In item 210 in FIG. 9, and as shown in FIGS. 4A-4B, additional etch processing is performed to etch away sacrificial material 112, high-k 110, bottom spacer 108 that are not protected by first protective layer 120 and spacer, additional protective structures 122 (such as a thin oxide layer sidewall spacer) can also be formed (deposited or grown) to protect exposed sacrificial gate materials 112, gate insulator 110, and spacer 108. After such protective layers 120, 122 are in place, as shown in FIGS. 4A-4B, these methods remove (e.g., using etching, stripping, etc.) any remaining bottom spacer 110 and a portion of the lower conductive source/drain structure 104 that is not protected by the protective layers 120, 122 (in item 212 in FIG. 9) to leave sidewalls of the lower conductive source/drain structure 104 exposed, which forms a trench 131 between adjacent transistors, and a buried contact area 133.

As shown in FIG. 4B, the buried contact (cavity) area 133 is in the lower conductive source/drain structure 104 on a first side of the semiconductor fin structure 106. The buried contact area 133 (and the later-formed buried contact 134) is formed in item 212 in FIG. 9 to be positioned approximately the same distance from the substrate 100 that the lower conductive source/drain structure 104 is positioned from the substrate 100 (e.g., within the bottom 154 of the transistor structure 150) with possibly a small amount of the lower conductive source/drain structure 104 remaining at the bottom of the trench 131 and the buried contact area 133. This provides a larger area to land the later-formed contact (142). This also reduces the resistance by providing the later-formed buried contact 134 that is almost (e.g., 90%) the same thickness (height above the substrate 100) as the lower conductive source/drain structure 104, yet uses much lower resistance material (e.g., metal vs. doped silicon), as described below.

This allows the methods herein to form a silicide layer 124 on the exposed sidewalls of the lower conductive source/drain structure 104 in the buried contact area 133 in item 214. As is understood by those ordinarily skilled in the art, a silicide process generally involves forming a metal over a silicon material, and then heating the structure to cause the upper portion of the silicon material to absorb some of the metal and become a silicide. Any unreacted metal is then removed to leave the silicided walls of the silicon material.

Figure 5A:
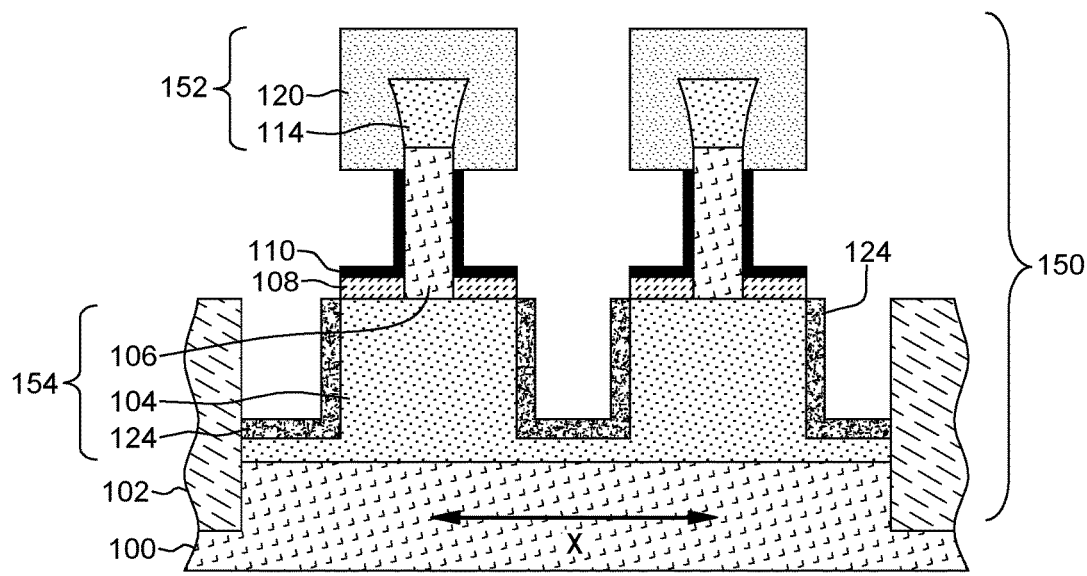
Figure 5B:
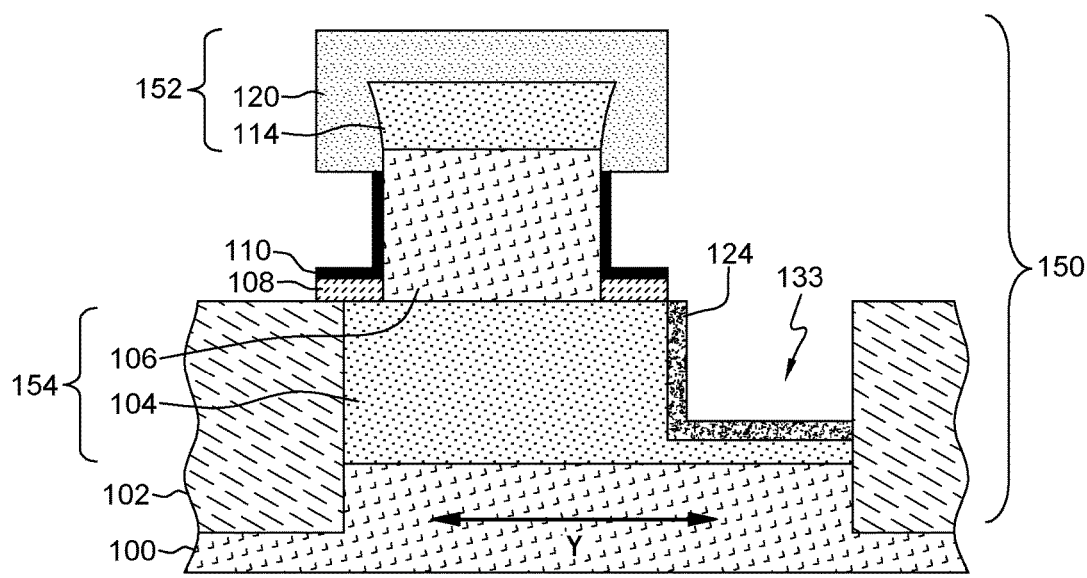
Figure 6A:
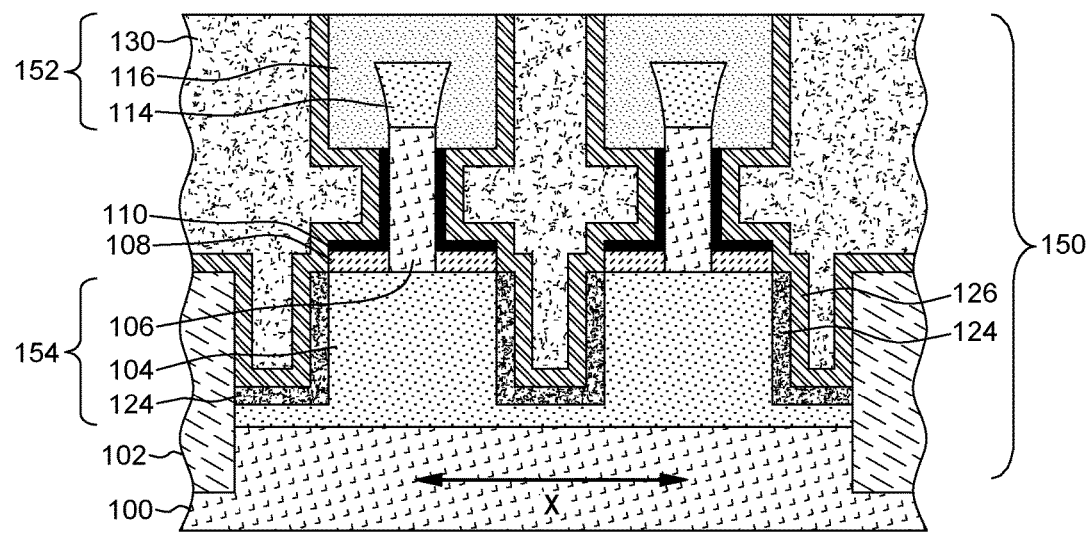
Figure 6B:
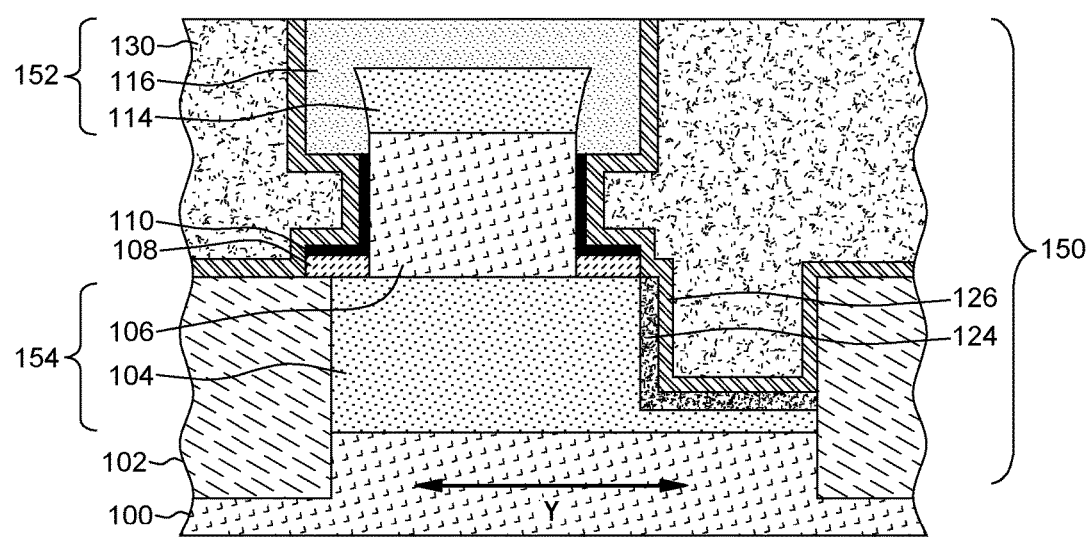

Such methods also remove the sacrificial gate layer 112 in item 216 (FIG. 9) to leave the gate insulator layer 110 exposed and to create a gate cavity under the top spacers 120, and this is also shown in FIGS. 5A-5B. Following this, such methods deposit a first conformal work function metal layer 126 on the silicide layer 124 in the buried contact 134 layer, and around the semiconductor fin structure 106 on the gate insulator layer 110, in item 218 in FIG. 9 (and this is shown in FIGS. 6A-6B). As is known, the work function of a metal is the unit-less measure of the minimum amount of thermodynamic work (i.e. energy) needed to remove an electron from a solid to a point in the vacuum immediately outside the solid surface of the metal, and work function metals used to set the correct threshold Vt for the device can include, for example, TiN, TiAlC, TiC, TaN, etc.

Further, these methods deposit a second conductor 130 on the first conformal metal layer 126, in item 220, to fill all empty areas from the bottom 154 of the transistor structure 150 to the top 152 of the transistor structure 150 with the second conductor 130. The first conformal metal layer 126 formed in item 218 has a work function that sets the correct Vt for the devices, and the second conductor 130 formed in item 220 is a different metal having lower resistance to provide better conductivity, and it can be W, Al, Ru, or Co.

In item 222 in FIG. 9 (and as shown in FIGS. 7A-7B), these methods further pattern a second protective layer 138 on the second conductor 130 on a second side of the semiconductor fin structure 106 that is opposite the first side of the semiconductor fin structure 106 where the buried contact area 133 is located. This allows such methods to remove portions of the first conformal metal layer 126 and the second conductor 130 not protected by the second protective layers 102, 120, 138 (in item 224 in FIG. 9) to leave the silicide 124, the first conformal metal layer 126, and the second conductor 130 in the buried contact area 133 as a buried conductive contact 134. Further, this leaves the first conformal metal layer 126 and the second conductor 130 around the semiconductor fin structure 106 on the gate insulator layer 110 as a gate conductor 132. Also, the first conformal metal layer 126 surrounds three sides of the gate conductor 132 in locations where the gate conductor 132 is adjacent the semiconductor fin structure 106, and therefore, the first conformal metal layer 126 has a "U" shape or "C" shape in cross-section (which is different from the "L" shape of the gate insulator 110 in cross-section. More specifically, in locations where the gate conductor 132 is adjacent the semiconductor fin structure 106, the first conformal metal layer 126 is first adjacent (and parallel to) the bottom spacer 108, secondly adjacent (and parallel to) the fin 106 sidewall, and thirdly adjacent (and parallel to) the first protective layer 120, as the first conformal metal layer 126 surrounds the three sides of the gate conductor 132 (and this allows the first conformal metal layer 126 to have a "U" or "C" shape in cross-section).

Again, this forms the buried contact 134 to be positioned approximately the same distance from the substrate 100 that the lower conductive source/drain structure 104 is positioned from the substrate 100 (e.g., within the bottom 154 of the transistor structure 150) with possibly a small amount of the lower conductive source/drain structure 104 remaining at the bottom of the trench 131 and the buried contact area 133. This provides a larger area to land the later-formed contact (142). This also reduces the resistance by providing that the buried contact 134 is almost (e.g., 90%) the same thickness (height above the substrate 100) as the lower conductive source/drain structure 104, yet uses much lower resistance material (e.g., metal vs. doped silicon).

Additionally, as shown in FIGS. 7A-7B, because of the second protective layer formed in item 222, the portion of the first conformal metal layer 126 and the second conductor 130 protected by the second protective layer form a raised contact portion 135 extending from a location around the semiconductor fin structure 106 toward the top 152 of the transistor 150 in the removal process in item 224 in FIG. 9. The raised contact portion 135 of the gate conductor 132 (and the conformal metal 126) is formed to extend toward the top 152 of the transistor structure 150 further from the substrate 100 than the upper conductive source/drain structure 114 is positioned from the substrate 100.

As can be seen in FIGS. 7A-7B, the buried contact 134 has a rectangle shape (or rectangular box or rectangular cuboid shape), and the lower source/drain 104 contacts at least two sides of the rectangle shape of the buried contact 134. Also, the silicide 124 and the first conformal metal 126 are positioned between the buried contact and the lower source/drain, along at least two of the sides of the rectangle shape of the buried contact 134 (and, indeed, the conformal metal 126 is positioned along at least three of the sides of the rectangle shape of the buried contact 134).

As shown in FIGS. 8A-8B, the methods herein then cover the transistor structure 150 with a second insulator layer 144 (e.g., oxide, nitride, etc.) filling all voids/spaces from the bottom 154 of the transistor structure 150 to the top 152, as shown in item 226 in FIG. 9. Next, this processing patterns the second insulator layer 144 to form contact openings in the second insulator layer 144 to the buried contact 134, to the upper conductive source/drain structure 114, and to the raised contact portion 133 of the gate conductor 132, as shown in FIGS. 8A-8B, and item 228 in FIG. 9.

This allows such methods to form conductive contacts by depositing or growing conductive material in the contact openings, in item 230 in FIG. 9, including: a first contact 140 extending through the second insulator layer 144 to the buried contact 134; a second contact 138 extending through the second insulator layer 144 to the upper conductive source/drain structure 114; and a third contact 142 extending through the second insulator layer 144 to the raised contact portion 133 of the gate conductor 132. As shown in FIGS. 8A-8B, the first contact 140 is formed longer than the second contact 138, and the second contact 138 is formed longer than the third contact 142.

As shown in FIGS. 8A-8B, this forms a structure that includes (among other components) a substrate 100 located at the bottom 154 of a transistor structure 150. In such structures, a lower conductive source/drain structure 104 contacts the substrate 100, and a conductive buried contact 134 is lateral to, and electrically connected to, the lower conductive source/drain structure 104 at the bottom 154 of the transistor structure 150. The conductive buried contact 134 is positioned approximately the same distance from the substrate 100 that the lower conductive source/drain structure 104 is positioned from the substrate 100. Further, a silicide layer 124 is between the conductive buried contact 134 and the lower conductive source/drain structure 104.

Also, these structures include a semiconductor fin structure 106 that contacts the lower conductive source/drain structure 104, and extends away from the bottom 154 of the transistor structure 150 toward the top 152 of the transistor structure 150. A gate insulator layer 110 (high-K insulator) laterally contacts (and surrounds) the middle of the semiconductor fin structure 106, that is between the ends of the semiconductor fin structure 106. The gate insulator layer 110 has a "L" shape when viewed in cross-section and, therefore, the gate insulator layer is positioned only along intersecting perpendicular planes formed by the semiconductor fin structure 106 and the bottom spacer layer 108.

Further, a first conformal metal layer 126 laterally contacts the gate insulator layer 110, and gate conductor 132 surrounds the semiconductor fin structure 106 and laterally contacts the first conformal metal layer 126. Additionally, a bottom spacer layer 108 contacts the semiconductor fin structure 106 and the lower conductive source/drain structure 104 at a location where the semiconductor fin structure 106 contacts the lower conductive source/drain structure 104. The bottom spacer layer 108 electrically separates the lower conductive source/drain structure 104 from the gate conductor 132.

Therefore, the gate insulator layer 110 and the first conformal metal layer 126 are between the semiconductor fin structure 106 and the gate conductor 132. Also, the first conformal metal layer 126 surrounds three sides of the gate conductor 132 in locations where the gate conductor 132 is laterally adjacent the semiconductor fin structure 106, and therefore, the first conformal metal layer 126 has a "U" shape in cross-section (which is different from the "L" shape of the gate insulator 110 in cross-section).

Additionally, the gate conductor 132 includes a raised contact portion 133 extending from a location around the semiconductor fin structure 106 toward the top 152 of the transistor. The raised contact portion 135 of the gate conductor 132 extends toward the top 152 of the transistor structure 150 further from the substrate 100 than the upper conductive source/drain structure 114 is positioned from the substrate 100.

The first conformal metal layer 126 is also separately located laterally adjacent the conductive buried contact 134, and the first conformal metal layer 126 laterally contacts the silicide layer 124. More specifically, the first conformal metal layer 126 is between the silicide layer 124 and the conductive buried contact 134. Thus, the silicide layer 124 and the first conformal metal layer 126 physically and electrically connect the conductive buried contact 134 to the lower conductive source/drain structure 104. The gate conductor 132 and the conductive buried contact 134 can be a different metal having a different work function (with a lower resistance) relative to the work function of the first conformal metal layer 126.

An upper conductive source/drain structure 114 contacts the opposite end of the semiconductor fin structure 106 from where the lower conductive source/drain structure 104 contacts the semiconductor fin structure 106, at the top 152 of the transistor structure 150. The upper conductive source/drain structure 114 has a flared shape that is relatively smaller where the upper conductive source/drain structure 114 contacts the semiconductor fin structure 106, and relatively larger where the upper conductive source/drain structure 114 contacts the second conductive contact.

An insulator covers the transistor structure 150, and a first conductive contact extends through the insulator from the top 152 of the transistor to the conductive buried contact 134. Further, a second conductive contact extends through the insulator from the top 152 of the transistor to the upper conductive source/drain structure 114, and a third conductive contact extends through the insulator from the top 152 of the transistor to the raised conductive contact portion of the gate conductor 132. The first contact 140 is longer than the second contact 138, and the second contact 138 is longer than the third contact 142.

Figure 10:
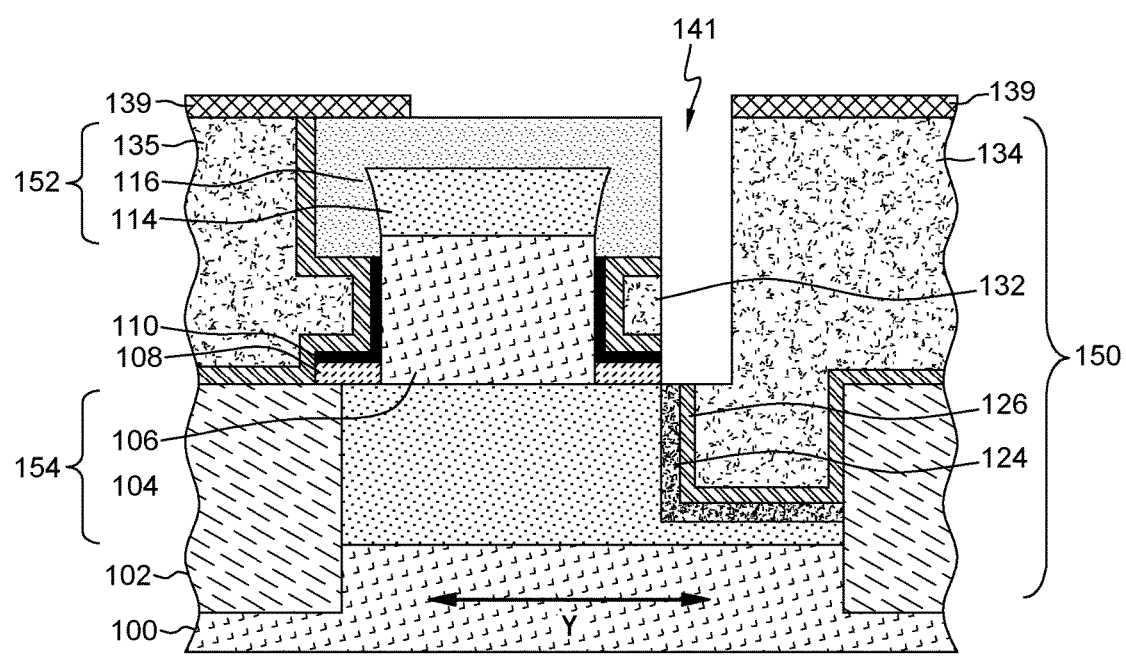
FIG. 10 is a cross-sectional diagram of transistor structures according to embodiments herein.

An alternative embodiment is shown in FIG. 10. More specifically, the structure show in FIG. 10 begins with the structure shown in FIG. 6B; and rather than reducing the height of the second conductor as shown in FIG. 7B; in FIG. 10, a different mask 139 (that is otherwise similar to mask 138) is used to form an opening 141 (that is later filled with an insulator 144) that separates the gate conductor 132 that is next to the fin 106 from the conductive buried contact 134. The remaining structures are formed as discussed above. This allows the later formed third contact 142 to the conductive buried contact 134 to be easily made in the way that the first contact 140 is made to the gate conductor 132 (as a raised contact portion).

The figures discussed above illustrate multiple transistors. Such transistors can be formed in groups of similar transistors, or in complementary pairs of opposite type transistors (e.g., P-type and N-type transistors). A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The flowchart and block diagrams in the figures illustrate the architecture, functionality, and operation of possible implementations of devices and methods according to various embodiments. For example, two blocks shown in succession may, in fact, be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A structure comprising:
a lower source/drain contacting a substrate;
a fin extending from the lower source/drain;
an upper source/drain contacting an opposite end of the fin from where the lower source/drain contacts the fin;
a gate conductor surrounding the fin, and electrically insulated from the fin;
a buried contact electrically connected to the lower source/drain, the buried contact having a rectangular shape, and the lower source/drain contacting at least two sides of the rectangular shape of the buried contact;
a silicide and a first conformal metal positioned between the buried contact and the lower source/drain, along the at least two sides of the rectangular shape of the buried contact;
a second conformal metal positioned between the gate conductor and the fin;
a first contact extending to the buried contact;
a second contact extending to the upper source/drain; and
a third contact extending to the gate conductor.

2. The structure according to claim 1, a raised contact portion of the gate conductor extending further from the substrate than the upper source/drain.

3. The structure according to claim 1, the buried contact being positioned the same height from the substrate as the lower source/drain.

4. The structure according to claim 1, the gate conductor and the buried contact comprising a metal different from the first conformal metal and the second conformal metal.

5. The structure according to claim 1, the upper source/drain comprising a flared shape that is relatively smaller where the upper source/drain contacts the fin, and relatively larger where the upper source/drain contacts the second contact.

6. The structure according to claim 1, further comprising a gate insulator layer between the gate conductor and the fin, the gate insulator layer comprising a high-K insulator.

7. The structure according to claim 1, the first contact being longer than the second contact, and the second contact being longer than the third contact.

8. A transistor structure comprising:
a substrate;
a lower conductive source/drain structure contacting the substrate;
a conductive buried contact electrically connected to the lower conductive source/drain structure, the conductive buried contact having a rectangular shape, and the lower conductive source/drain structure contacting at least two sides of the rectangular shape of the conductive buried contact;
a silicide layer between the conductive buried contact and the lower conductive source/drain structure along the at least two sides of the rectangular shape of the conductive buried contact;
a semiconductor fin structure contacting the lower conductive source/drain structure;
a bottom spacer layer on the lower conductive source/drain structure and abutting the semiconductor fin structure;
a gate insulator layer positioned only along intersecting perpendicular planes formed by the semiconductor fin structure and the bottom spacer layer;
a first conformal metal layer contacting the silicide layer, the first conformal metal layer being between the silicide layer and the conductive buried contact, and the silicide layer and the first conformal metal layer physically and electrically connecting the conductive buried contact and the lower conductive source/drain structure;
a gate conductor around the semiconductor fin structure;
a second conformal metal layer positioned between the gate conductor and the semiconductor fin structure, the gate insulator layer and the second conformal metal layer being between the semiconductor fin structure and the gate conductor, and the second conformal metal layer surrounding three sides of the gate conductor in locations where the gate conductor is adjacent the semiconductor fin structure;
an upper conductive source/drain structure contacting an opposite end of the semiconductor fin structure from where the lower conductive source/drain structure contacts the semiconductor fin structure;

a first conductive contact extending to the conductive buried contact;

a second conductive contact extending to the upper conductive source/drain structure; and a third conductive contact extending to the gate conductor.

9. The transistor structure according to claim 8, a raised contact portion of the gate conductor extending further from the substrate than the upper conductive source/drain structure.

10. The transistor structure according to claim 8, the conductive buried contact being positioned the same height from the substrate as the lower conductive source/drain structure.

11. The transistor structure according to claim 8, the gate conductor and the conductive buried contact comprising a metal different from the first conformal metal layer and second conformal metal layer.

12. The transistor structure according to claim 8, the upper conductive source/drain structure comprising a flared shape that is relatively smaller where the upper conductive source/drain structure contacts the semiconductor fin structure, and relatively larger where the upper conductive source/drain structure contacts the second conductive contact.

13. The transistor structure according to claim 8, the gate insulator layer comprising a high-K insulator.

14. The transistor structure according to claim 8, the first conductive contact being longer than the second conductive contact, and the second conductive contact being longer than the third conductive contact.

15. A method comprising:

forming a semiconductor fin structure on a lower conductive source/drain structure;

removing a portion of the lower conductive source/drain structure to leave sidewalls of the lower conductive source/drain structure exposed and form a buried contact area in the lower conductive source/drain structure;

forming a silicide layer on the sidewalls of the lower conductive source/drain structure in the buried contact area;

depositing a first conformal metal layer on the silicide layer and around the semiconductor fin structure;

depositing a second conductor on the first conformal metal layer;

patterning a second protective layer on a second side of the semiconductor fin structure that is opposite the buried contact area;

removing portions of the first conformal metal layer and the second conductor not protected by the second protective layer to leave the first conformal metal layer and the second conductor in the buried contact area as a conductive buried contact, and around the semiconductor fin structure as a gate conductor, the conductive buried contact having a rectangular shape, the lower conductive source/drain structure contacting at least two sides of the rectangular shape of the conductive buried contact, and a portion of the first conformal metal layer and the second conductor protected by the second protective layer forming a raised contact portion; and forming a first conductive contact extending to the conductive buried contact, and a second conductive contact extending to the raised contact portion of the gate conductor.

16. The method according to claim 15, the raised contact portion of the gate conductor being formed to extend further from a substrate than a upper conductive source/drain structure.

17. The method according to claim 15, the conductive buried contact being formed to be positioned the same height from a substrate as the lower conductive source/drain structure.

18. The method according to claim 15, the second conductor comprising a metal different from the first conformal metal layer.

19. The method according to claim 15, further comprising forming an upper conductive source/drain structure on the semiconductor fin structure to have a flared shape that is relatively smaller where the upper conductive source/drain structure contacts the semiconductor fin structure.

20. The method according to claim 15, further comprising forming a gate insulator layer as a high-K insulator.

* * * * *